United States Patent
Fu et al.

(10) Patent No.: US 8,023,310 B2
(45) Date of Patent: Sep. 20, 2011

(54) NONVOLATILE MEMORY CELL INCLUDING CARBON STORAGE ELEMENT FORMED ON A SILICIDE LAYER

(75) Inventors: Chu-Chen Fu, San Ramon, CA (US);
Tanmay Kumar, Pleasanton, CA (US);
Er-Xuan Ping, Fremont, CA (US);
Huiwan Xu, Sunnyvale, CA (US)

(73) Assignee: SanDisk 3D LLC, Milpitas, CA (US)

( * ) Notice: Subject to any disclaimer, the term of this patent is extended or adjusted under 35 U.S.C. 154(b) by 355 days.

(21) Appl. No.: 12/320,008

(22) Filed: Jan. 14, 2009

(65) Prior Publication Data
US 2010/0176366 A1 Jul. 15, 2010

(51) Int. Cl.
G11C 11/00 (2006.01)
G11C 11/56 (2006.01)
H01L 29/06 (2006.01)
(52) U.S. Cl. .................. 365/148; 365/163; 257/2; 257/5
(58) Field of Classification Search .................. 365/148, 365/163; 257/2, 5
See application file for complete search history.

(56) References Cited

U.S. PATENT DOCUMENTS

| | | | | |
|---|---|---|---|---|
| 3,404,061 | A | * | 10/1968 | Shane et al. |
| 5,915,167 | A | * | 6/1999 | Leedy |
| 6,055,180 | A | * | 4/2000 | Gudesen et al. |
| 6,706,402 | B2 | * | 3/2004 | Rueckes et al. |
| 6,853,049 | B2 | * | 2/2005 | Herner |
| 7,081,377 | B2 | * | 7/2006 | Cleeves |
| 7,105,108 | B2 | * | 9/2006 | Kaschak et al. |
| 7,176,064 | B2 | * | 2/2007 | Herner |
| 7,586,773 | B2 | * | 9/2009 | Herner ........................... 365/105 |
| 7,667,999 | B2 | * | 2/2010 | Herner et al. .................. 365/148 |
| 2005/0226067 | A1 | * | 10/2005 | Herner et al. |
| 2006/0250836 | A1 | * | 11/2006 | Herner et al. |
| 2006/0250837 | A1 | * | 11/2006 | Herner et al. |
| 2007/0164309 | A1 | * | 7/2007 | Kumar |
| 2008/0280390 | A1 | * | 11/2008 | Kim et al. ....................... 438/95 |
| 2010/0108972 | A1 | * | 5/2010 | Zhao et al. ....................... 257/2 |
| 2010/0157651 | A1 | * | 6/2010 | Kumar et al. ................... 365/148 |
| 2010/0163824 | A1 | * | 7/2010 | Xu et al. .......................... 257/2 |

OTHER PUBLICATIONS

U.S. Appl. No. 12/007,780, filed Jan. 15, 2008, Herner et al.*
U.S. Appl. No. 12/007,781, filed Jan. 15, 2008, Dunton et al.*
U.S. Appl. No. 09/560,626, filed Apr. 28, 2000, Knall.*
U.S. Appl. No. 12/153,872, filed May 27, 2008, Chen et al.*
U.S. Appl. No. 12/153,873, filed May 27, 2008, Chen et al.*
U.S. Appl. No. 12/314,903, filed Dec. 18, 2008, Kumar.*
U.S. Appl. No. 12/153,874, filed May 27, 2008, Chen et al.*
U.S. Appl. No. 12/222,341, filed Aug. 7, 2008, Kumar et al.*
A. M. Rao et al., In situ-grown carbon nanotube array with excellent field emission characteristics, Applied Physics Letters, (2000), pp. 3813-3815, vol. 76, No. 25.

(Continued)

*Primary Examiner* — Evan Pert
(74) *Attorney, Agent, or Firm* — The Marbury Law Group, PLLC (57) ABSTRACT

A nonvolatile memory cell includes a storage element, the storage element comprising a carbon material, a steering element located in series with the storage element, and a metal silicide layer located adjacent to the carbon material. A method of making a device includes forming a metal silicide over a silicon layer, forming a carbon layer over the metal silicide layer, forming a barrier layer over the carbon layer, and patterning the carbon layer, the metal silicide layer, and the silicon layer to form an array of pillars.

26 Claims, 7 Drawing Sheets

OTHER PUBLICATIONS

Tomohiro Nozaki et al., Fabrication of vertically aligned single-walled carbon nanotubes in atmospheric pressure non-thermal plasma CVD, Carbon, (2007), pp. 364-374, vol. 45.

E. Salonen et al., Ion-irradiation-induced defects in bundles of carbon nanotubes, Nuclear Instruments and Methods in Physics Research B, (2002), pp. 603-608, vol. 193.

Jun Li et al., Bottom-up approach for carbon nanotube interconnects, Applied Physics Letters, (2003), pp. 2491-2493, vol. 82, No. 15.

Hua-Chiang Wen et al., Effects of ammonia plasma treatment on the surface characteristics of carbon fibers, Surface & Coatings Technology, (2006), pp. 3166-3169, vol. 200.

M Meyyappan et al., Carbon nanotube growth by PECVD: a review, Plasma Sources Sci. Technol., (2003), pp. 205-216, vol. 12.

Y. Abdi et al., PECVD-grown carbon nanotubes on silicon substrates with a nickel-seeded tip-growth structure, Materials Science and Engineering C, (2006), pp. 1219-1223, vol. 26.

J. B. Cui et al., Carbon nanotube memory devices of high charge storage stability, Applied Physics Letters, (2002), pp. 3260-3262, vol. 81, No. 17.

Young Min Shin et al., Influence of morphology of catalyst thin film on vertically aligned carbon nanotube growth, Journal of Crystal Growth, (2004), pp. 81-89, vol. 271.

P. Smith et al., Polishing TiN for Nanotube Synthesis, Proceedings of the 16th Annual Meeting of the American Society for Precision Engineering, (2001), Crystal City, VA.

Kevin Bullis, TR10: Graphene Transistors a new form of carbon being pioneered by Walter de Neer of Georgia Tech could lead to speedy, compact computer processors, Technology Review, (2008), vol. 20242.

William S. Hummers et al., Preparation of Graphitic Oxide, Journal of American Chemical Society, (1958), pp. 1339, vol. 80.

K.S. Novoselov et al., Electric field effect in atomically thin carbon films, Science, (2004), pp. 666-669, vol. 306.

Dan Li et al., Processable aqueous dispersions of graphene nanosheets, Nature Nanotechnology, (2008), pp. 101-105, vol. 3, Nature Publishing Group.

Nina Kovtyukhova et al., Layer-by-layer assembly of ultrathin composite films from micron-sized graphite oxide sheets and polycations, American Chemical Society (1999), pp. 771-778, vol. 11.

* cited by examiner

FIG – 5i

NONVOLATILE MEMORY CELL INCLUDING CARBON STORAGE ELEMENT FORMED ON A SILICIDE LAYER

BACKGROUND OF THE INVENTION

The invention relates to a nonvolatile memory array and a method of making thereof.

Nonvolatile memory arrays maintain their data even when power to the device is turned off. In one-time programmable arrays, each memory cell is formed in an initial unprogrammed state, and can be converted to a programmed state. This change is permanent, and such cells are not erasable. In other types of memories, the memory cells are erasable, and can be rewritten many times.

Cells may also vary in the number of data states each cell can achieve. A data state may be stored by altering some characteristic of the cell which can be detected, such as current flowing through the cell under a given applied voltage or the threshold voltage of a transistor within the cell. A data state is a distinct value of the cell, such as a data '0' or a data '1'.

SUMMARY

An embodiment of the invention provides a nonvolatile memory cell, including a storage element, the storage element comprising a carbon material, a steering element located in series with the storage element, and a metal silicide layer located adjacent to the carbon material.

Another embodiment of the invention provides a method of making a device, including forming a metal silicide over a silicon layer, forming a carbon layer over the metal silicide layer, forming a barrier layer over the barrier layer, the carbon layer, and patterning the carbon layer, the metal silicide layer, and the silicon layer to form an array of pillars.

Another embodiment of the invention provides a method of making a device, including forming a first conductive layer over a substrate, patterning the first conductive layer to form a plurality of bottom electrodes, forming a first insulating layer over and between the plurality of bottom electrodes, planarizing the first insulating layer to expose a top surface of the plurality of bottom electrodes, forming a silicon layer, forming a metal layer over the silicon layer, forming a protective layer over the metal layer, reacting the metal layer with the silicon layer to form a metal silicide layer, exposing a top surface of the metal silicide layer by removing the protective layer and any remaining metal layer portion, forming a carbon layer over the metal silicide layer, forming a barrier layer over the carbon layer, patterning at least the barrier layer, the carbon layer, the metal silicide layer, and the silicon layer to form an array of pillars, forming a second insulating layer over and between the array of pillars, planarizing the second insulating layer to expose a top surface of the array of pillars, and forming a plurality of upper electrodes.

DETAILED DESCRIPTION OF THE PREFERRED EMBODIMENTS

Figure 1A:
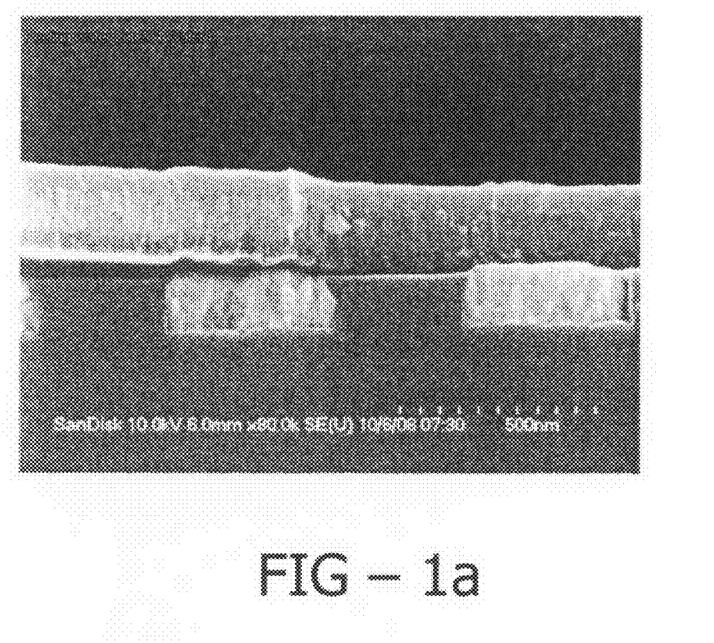
FIGS. 1a and 1b are micrographs of a structure according to comparative example and an example according to an embodiment of the invention, respectively.
Figure 1B:
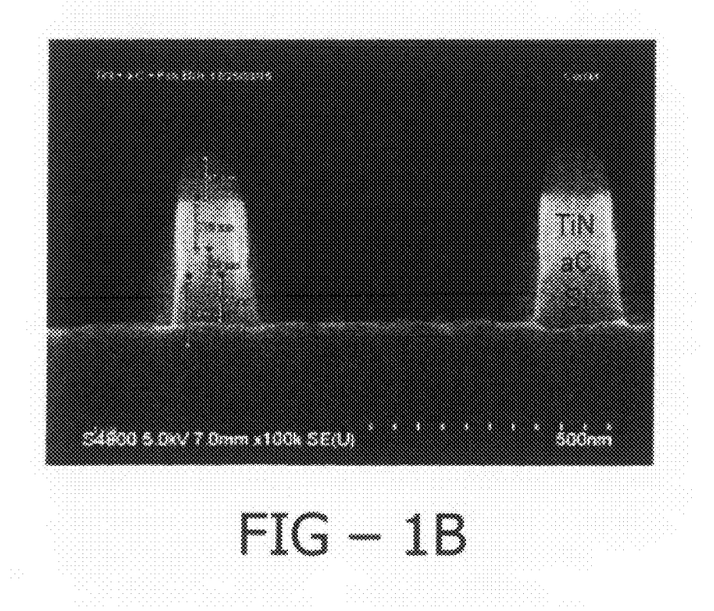

In preferred embodiments, the memory cell is a nonvolatile memory cell comprising a storage element containing a carbon material, a steering element located in series with the storage element, and a metal silicide layer located adjacent to the carbon material. The steering element may be a transistor or a diode. The present inventors discovered that if the carbon material is formed directly on a barrier layer, such as a TiN layer, then the carbon material, such as amorphous and/or polycrystalline carbon, exhibits poor adhesion and delamination. The present inventors realized that the carbon material may be formed on a metal silicide layer to improve the adhesion. One advantage of forming a metal silicide layer between the carbon storage element and the steering element is to reduce the possible peeling off or delamination of the carbon resistivity switching layer during the steps of making the device. Another advantage is that silicide formation over the diode allows the flexibility to fully form a polysilicon diode (which is annealed during the silicide formation anneal, such as RTA) before carbon material deposition. Of course, if desired, the diode anneal and the silicidation anneal may be conducted separately. A barrier layer, such as TiN is preferably omitted between the steering element and the carbon material. FIG. 1a is a micrograph showing peeling of polycrystalline carbon material formed on a TiN barrier layer located over a lower tungsten electrode. An upper TiN barrier and a silicon oxide layer are located over the carbon material. FIG. 1b is a micrograph which shows good adhesion of amorphous carbon material deposited on titanium silicide and patterned into pillars which includes a silicon diode below the silicide and a TiN barrier above the carbon material.

Figure 2A:
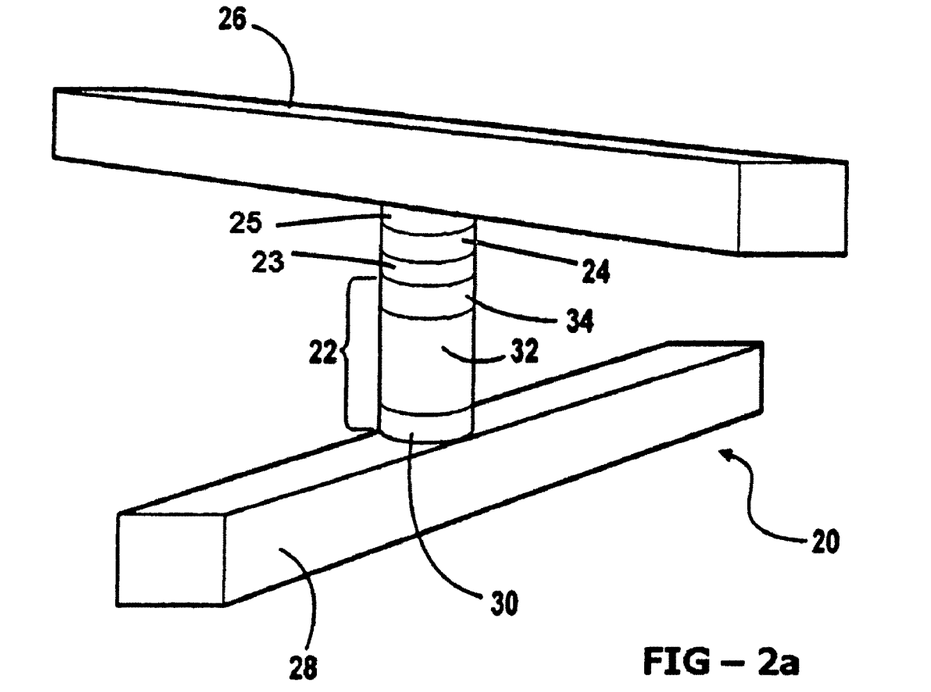
FIG. 2 is a perspective view of an array of memory cells of FIG. 1.

In some embodiments, a nonvolatile memory cell may comprise a bottom electrode, a steering element, a metal silicide layer, a carbon resistivity switching layer, an optional barrier layer, and an upper electrode. As illustrated in FIG. 2a, the diode 22, the metal silicide layer 23, the carbon resistivity switching layer 24, and the optional barrier layer 25 may be arranged in series between the bottom electrode 28 and the upper electrode 26.

In some embodiments, the steering element 22, the metal silicide layer 23, the carbon layer 24, and the optional barrier layer 25 have a substantial cylindrical pillar shape of a substantially same diameter. Alternatively, one or more of the diode 22, the metal silicide layer 23, the resistivity carbon switching material 24, and the barrier layer 25 may have a shape other than cylindrical, if desired.

The steering element 22 may comprise a p-i-n polysilicon diode, including a heavily doped semiconductor region 30 of a first conductivity type (such as n-type), an intermediate region 32 which is undoped semiconductor material or lightly doped semiconductor material (which will be referred to as an intrinsic region), and a heavily doped semiconductor region 34 of the second conductivity type (such as p-type). If desired, the location of the p and n-type regions may be reversed. The semiconductor material of the diode 22 is preferably silicon or an alloy of silicon and germanium. Other semiconductor materials may also be used.

The metal silicide layer 23 may comprise at least one of titanium silicide, platinum silicide, cobalt silicide, tungsten silicide, or nickel silicide. For example, in one embodiment, the metal silicide layer comprises titanium silicide.

The carbon resistivity switching layer 24 may comprise at least one of carbon nanotube (single walled, multi-walled, or a mixture of single and multi-walled nanotubes), amorphous carbon, polycrystalline carbon, graphene resistivity switching material, or a combination thereof. For example, in some embodiments, the carbon material comprises a polycrystalline carbon, amorphous carbon, or a combination of polycrystalline carbon and amorphous carbon. The resistivity of the carbon resistivity switching layer 24 may be increased or decreased in response to a forward and/or reverse bias provided between the electrodes 28 and 26.

The barrier layer 25 may comprise any suitable material that has good adhesion with the carbon layer 24, for example, titanium nitride. Other metals, such as tungsten, tungsten nitride, etc., may also be used. The bottom and upper electrodes may comprise any suitable conductive materials, such as tungsten, aluminum, copper, their alloys, tungsten nitride, titanium nitride, or a combination thereof. In some embodiments, for example, when the upper electrode 26 comprises titanium nitride or other materials having sufficiently good adhesion with the carbon layer 25, the barrier layer 25 may be omitted. Optionally, one or more barrier layers may be added underneath and/or over the bottom electrode 28.

Figure 2B:
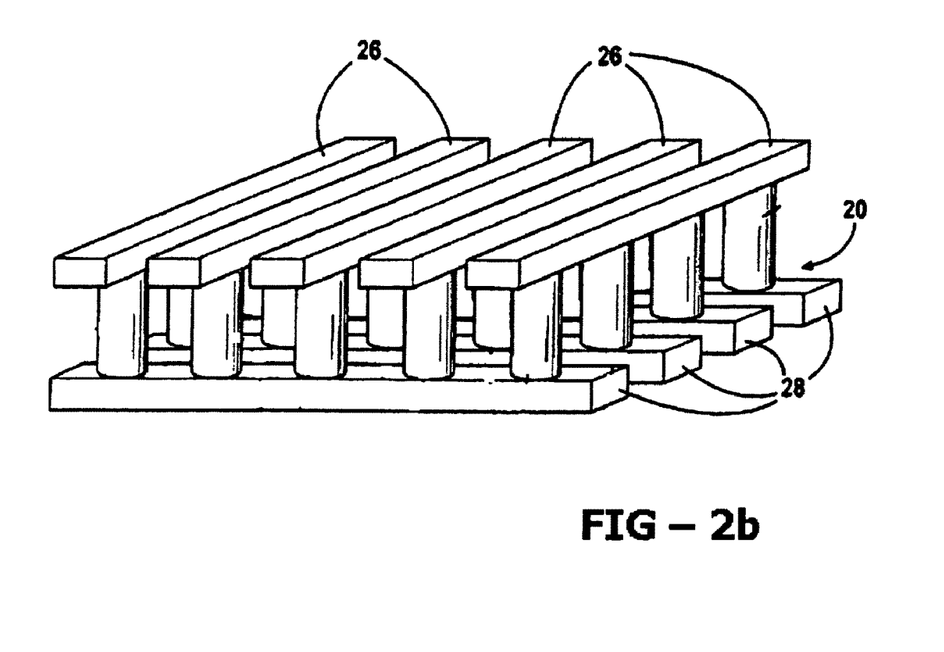

The memory cell 20 may comprise a read/write memory cell (one-time programmable) or re-writable nonvolatile memory cell. In a preferred non-limiting embodiment, a plurality of pillar-shaped devices which comprise a plurality of nonvolatile memory cells can be formed. As illustrated in FIG. 2b, a portion of a first memory level of memory cells 20 similar to the cell 20 of FIG. 2a is shown. Two, three, four, or more such memory levels, such as eight levels may be formed, stacked one atop the other, to form a monolithic three dimensional memory array, preferably formed above a substrate such as a monocrystalline silicon wafer. The diode pillars 22 preferably have a pitch of less than 100 nm, such as pitch of 78 nm or less and a diameter of 100 nm or less, such as 50 nm or less, such as 32 nm for example.

The bottom electrodes 28 can be formed either by subtractive or by Damascene methods. In a subtractive method, a conductive layer or film is patterned into spaced apart electrodes and the gaps between the electrodes are then filled with an insulating material. In a Damascene method, grooves are formed in an insulating material, a conductive layer or film is formed in the grooves and over the insulating layer, and then the conductive layer or film is planarized to leave spaced apart electrodes in the grooves.

Figure 3A:
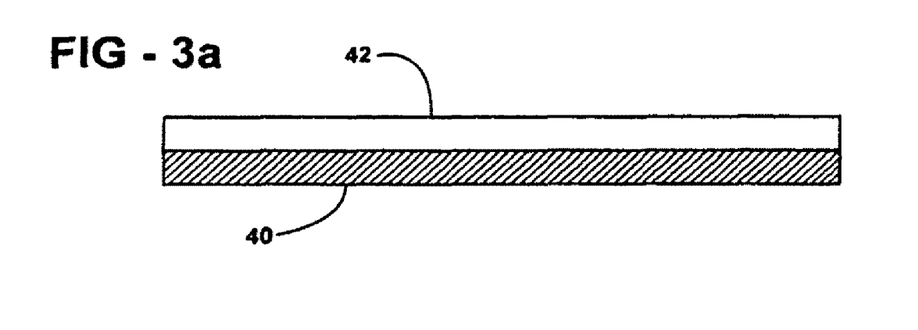
FIGS. 3a through 3d are cross-sectional side views illustrating steps in the process of forming conductive rails by a subtractive method.
Figure 3B:
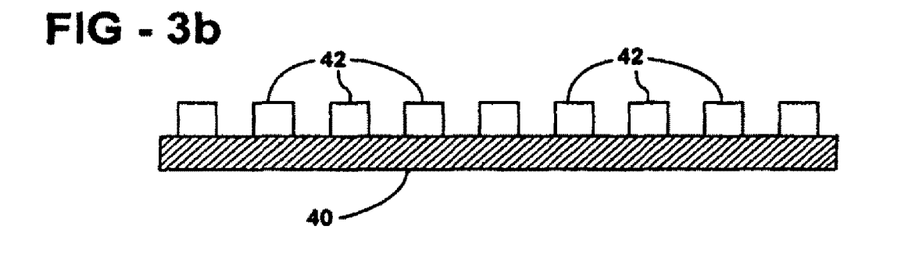
Figure 3C:
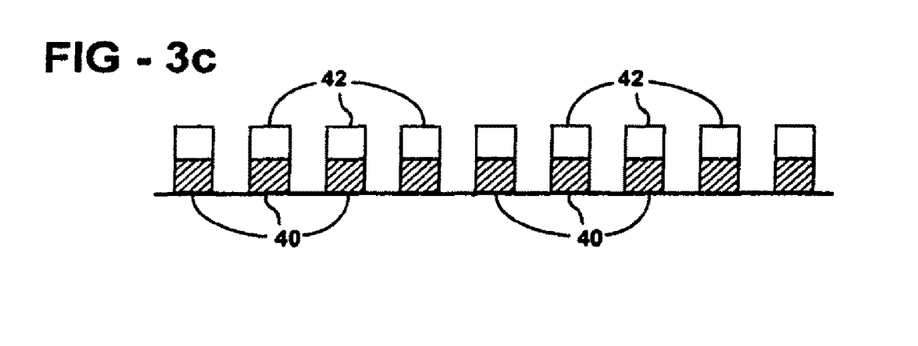
Figure 3D:
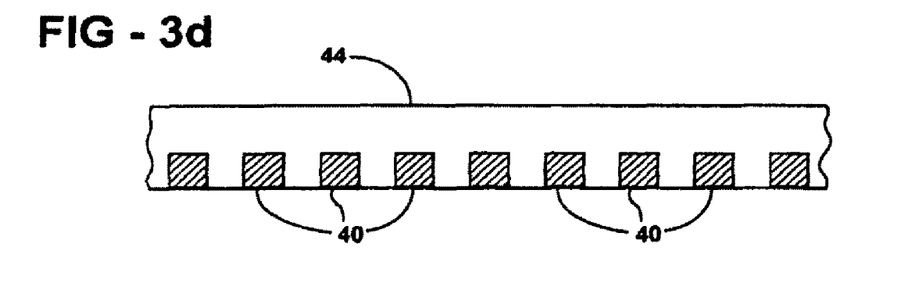

FIGS. 3a-3d illustrate the subtractive method of forming rail-shaped electrodes 28. As shown in FIG. 3a, one or more conductive layers 40, such as a W and/or a TiN layers are deposited over a substrate or an underlying structure (not shown), and a layer of photoresist 42 is spun onto it. As shown in FIG. 3b, the layer of photoresist 42 is then photolithographically patterned into the desired form. As shown in FIG. 3c, an etch step removes portions of the conductive layer(s) 40 where they are not protected by etched photoresist layer 42. As shown in FIG. 3d, after the etch, the photoresist layer 42 is stripped, leaving conductor or electrode rails 40 behind. The gaps between the rails 40 are filled with an insulating material 44, such as silicon oxide, silicon nitride or other insulating materials. If desired, any overfill of the insulating material 44 can be removed, for example by chemical-mechanical polishing (CMP), to expose the upper surface of the rails 40 in the planarized surface of the insulating layer 44.

Figure 4A:
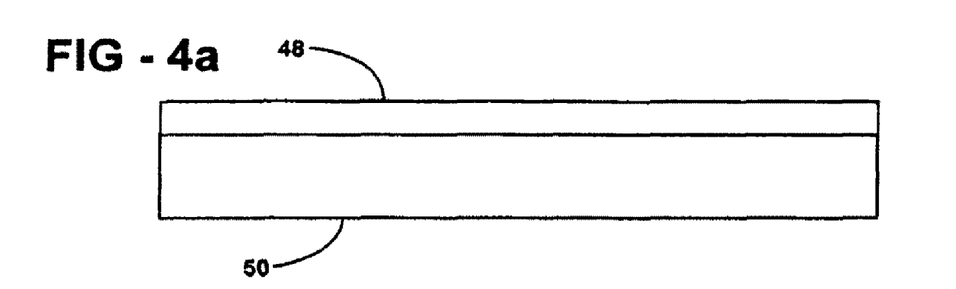
FIGS. 4a through 4d are cross-sectional side views illustrating steps in the process of forming conductive rails by a Damascene method.
Figure 4B:
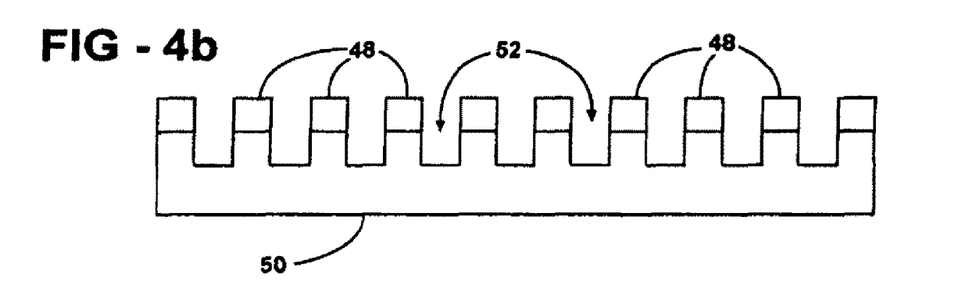
Figure 4C:
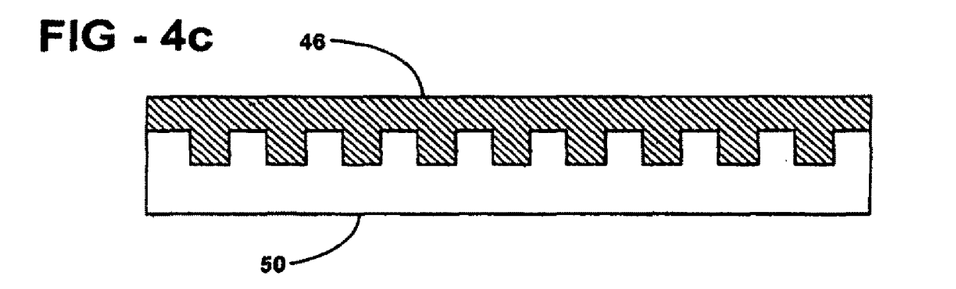
Figure 4D:
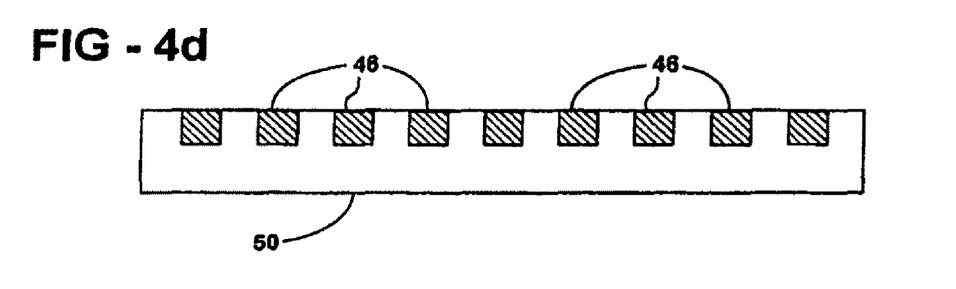

FIGS. 4a to 4d illustrate the Damascene method to form the electrode 28. First, a layer of photoresist 48 is spun onto a deposited insulating layer 50, such as a silicon oxide layer. As shown in FIG. 4b, the layer of photoresist 48 is patterned. An etch step then forms grooves or trenches 52 in the insulating layer 50. In FIG. 4c, after removal of the photoresist layer 48, one or more conductive layers 46, such as a W and/or TiN layers are deposited to fill the grooves or trenches 52. The one or more conductive layers 46 are planarized, for example by CMP or etchback, with the upper surface of the insulating layer to leave the rail shaped conductors in the grooves, as shown in FIG. 4d.

Figure 5A:
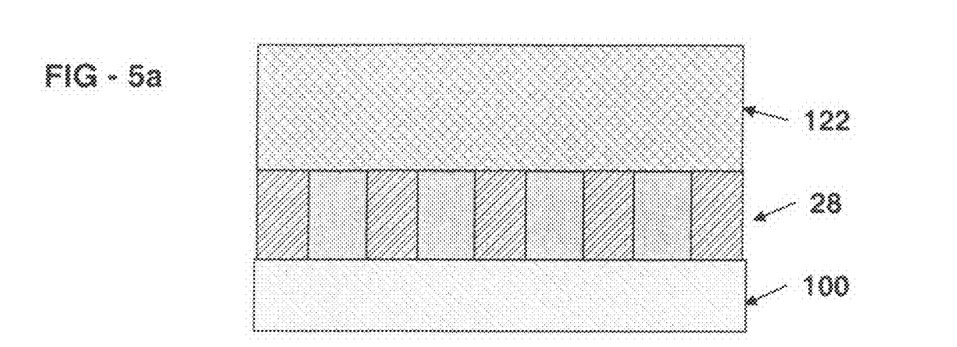
FIGS. 5a through 5i are cross-sectional side views of process steps of making a device array according to one embodiment of the invention.

Turning to FIG. 5a, a silicon layer 122 may be formed over the array of the bottom electrodes 28 separated from each other by an insulating material, a structure formed by the subtractive or Damascene methods described above with respect to FIGS. 3 or 4 respectively. The substrate 100 may be any suitable substrate, such as a wafer or a chip comprising a semiconductor (such as silicon), conductive, and/or insulating material. In some embodiments, the substrate 100 may comprise integrated circuits, such as driver circuits. The silicon layer 122 may comprise at least a first conductivity type sublayer, an intrinsic sublayer located over the first conductivity type sublayer, and a second conductivity type sublayer located over the intrinsic silicon sublayer. For example, the silicon layer 122 may comprise a lower n-type layer, a middle intrinsic layer and an upper p-type layer. If desired, the location of the p and n-type regions may be reversed. Optionally, a barrier layer (not shown), such as a titanium nitride or tungsten nitride layer, may be formed between the electrodes 28 and the silicon layer 122.

Figure 5B:
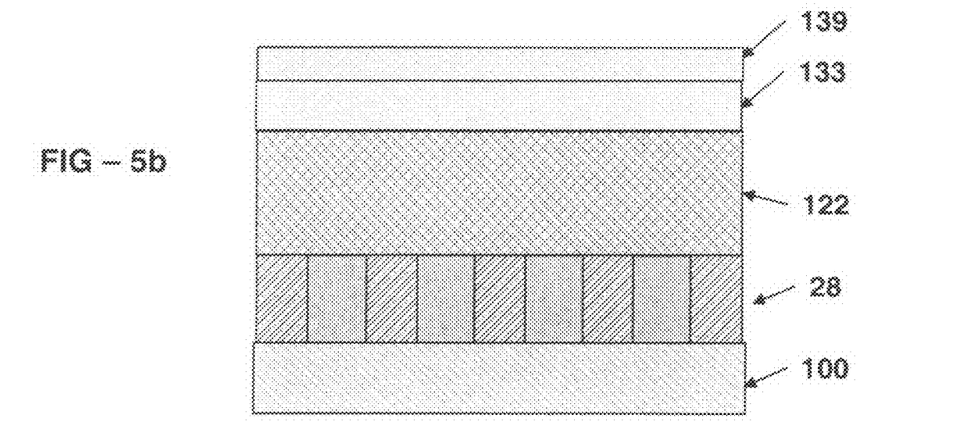

A metal layer 133 may be formed over the silicon layer 122, as shown in FIG. 5b. The metal layer 133 may comprise at least one of titanium, platinum, cobalt, tungsten, or nickel. Optionally, a protective layer 139 may be formed over the metal layer 133. The protective layer 139 may comprise any suitable barrier or protective material. For example, the protective layer 139 may be a conductive layer, such as a titanium nitride layer, or an insulating layer, such as a silicon nitride or silicon oxide layer. In some embodiments, the metal layer 133 comprises a titanium layer, such as a 1-10 nm, for example, a 2-5 nm thick titanium layer, and the protective layer 139 comprises a titanium nitride layer, such as a 15-25 nm, for example, a 18-20 nm thick titanium nitride layer.

Figure 5C:
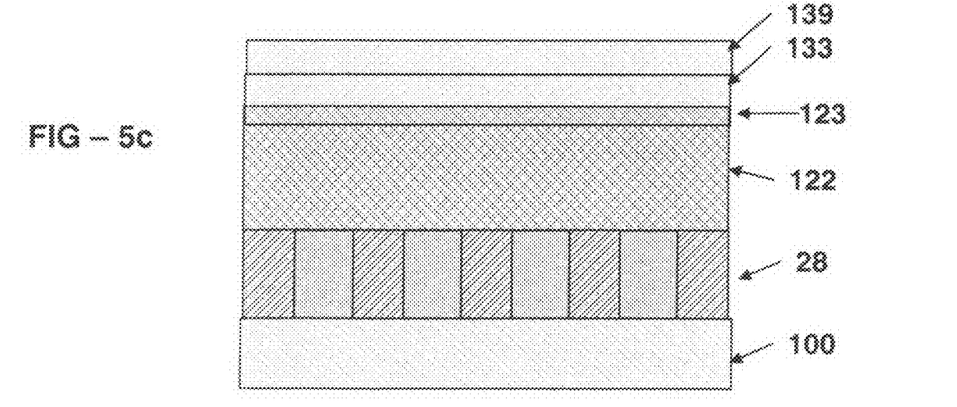

Next, as shown in FIG. 5c, a metal silicide layer 123 may be formed, by reacting the metal layer 133 with the upper portion of the silicon layer 122. In some embodiments, when the metal layer 133 is a titanium layer, the metal silicide layer 123 comprises titanium silicide. This reaction may be facilitated by any suitable method, such as thermal, flash lamp, or laser annealing, including Rapid Thermal Annealing (RTA).

Figure 5D:
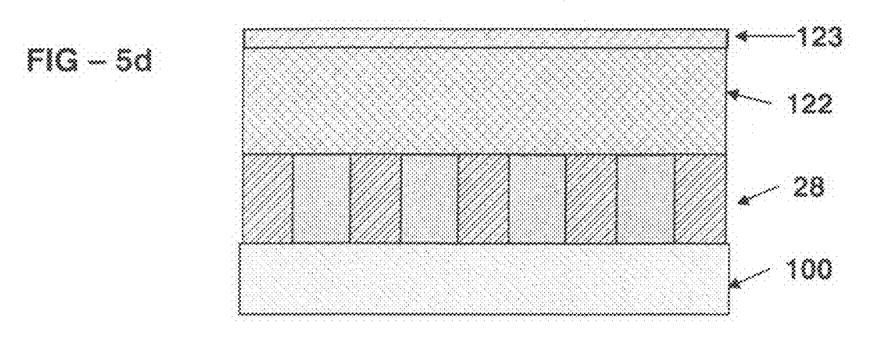

Further, after forming the silicide layer 123, the remaining portion of the metal layer 133 and the optional protective layer 139 may be removed to expose the top surface of the metal silicide layer, resulting in a structure illustrated in FIG. 5d. Any suitable method may be used to remove the remaining portion of the metal layer 133, and the protective layer 139 (if existing), for example, CMP, selective dry etching, or selective wet etching, such as an ammonium hydroxide wet etching. Alternatively, when the protective layer 139 comprises a material to which a carbon layer (referred to as layer 124 below) has a good adhesion, such as an insulating layer, for example a silicon nitride layer, the step of removing the remaining portion of the metal layer 133 (if any remains after forming the metal silicide 123) and the protective layer 139 may be omitted. Instead, a conductive filament can be formed between the metal silicide layer 123 and the carbon layer (referred to as layer 124 below) through the protective layer 139, by an application of a current or voltage to the device (in a way similar to an antifuse filament formation through an antifuse dielectric). Such an insulating layer containing a conductive filament, for example a silicon nitride layer containing a filament of titanium, titanium silicide, etc., provides a lower current through the resulting memory device.

Figure 5E:
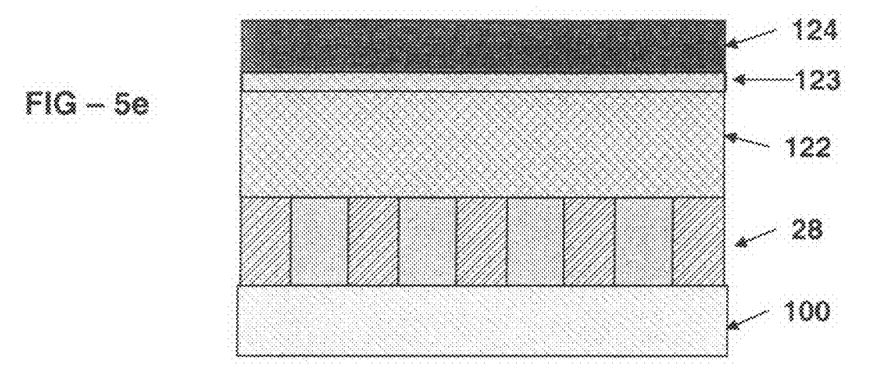

A carbon layer 124 can then be formed in contact with the metal silicide layer 123, resulting in a structure illustrated in FIG. 5e. The carbon layer 124 may comprise at least one of carbon nanotube, amorphous carbon, polycrystalline carbon, graphene resistivity switching material, or a combination thereof. In one embodiment, the carbon layer 124 comprises polycrystalline carbon. In another embodiment, the carbon layer 124 comprises amorphous carbon, or a combination of amorphous carbon and polycrystalline carbon. Layer 124 may be amorphous as deposited and then converted to polycrystalline carbon by subsequent annealing or thermal processing. The carbon layer 124 may be deposited by Chemical Vapor Deposition (CVD) or from solution as described in U.S. application Ser. No. 12/153,872, filed on May 27, 2008 and U.S. application Ser. No. 12/222,341, filed on Aug. 7, 2008, which are incorporated by reference in their entireties. For example, the CVD deposition method may comprise thermal CVD using $H_2$ and $C_2H_2$ source gas in a molar ratio of around 2:1 to 4:1, such as about 3:1, at a temperature of 650-750° C., such as around 700° C., for 0.5-3 minutes, such as 1 minute. Any other suitable method may also be used, such as Plasma Enhanced Chemical Vapor Deposition (PECVD), for depositing the carbon layer 124.

Figure 5F:
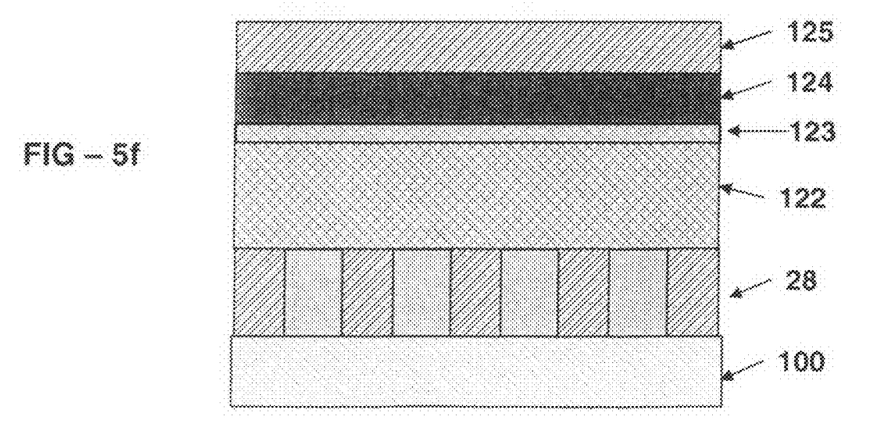

A barrier layer 125 can be formed over the carbon layer 124. In these embodiments, the carbon layer 124 is sandwiched between the metal silicide layer 123, and the barrier layer 125, as illustrated in FIG. 5f. The barrier layer 125 may comprise any material having good an adhesion with the carbon layer 124. For example, the barrier layer 125 may comprise a TiN layer.

Figure 5G:
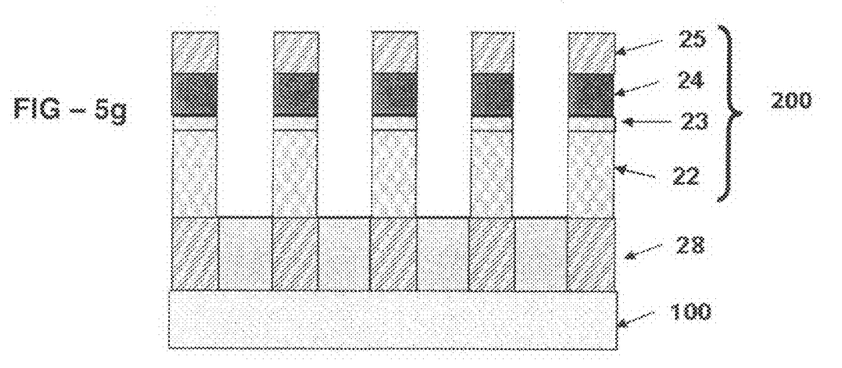

Turning to FIG. 5g, the barrier layer 125, the carbon layer 124, the metal silicide layer 123, and the silicon layer 122 can then be patterned to form an array of pillars 200. Each pillar 200 comprises a stack of pillar-shaped barrier layer 25, the carbon layer 24, the metal silicide layer 23, and the silicon layer 22.

The step of patterning comprises forming a mask over the barrier layer 125, and etching portions of the barrier layer 125, the carbon layer 124, the metal silicide layer 123, and the silicon layer 122 exposed by the mask during a single patterning step. In some embodiments, the step of forming the array of pillars 200 comprises patterning at least the barrier layer 125, the carbon layer 124, the metal silicide layer 123, and the silicon layer 122 in a single patterning step using same mask (i.e., the mask remains until silicon layer 122 is etched).

In some embodiments, the step of patterning comprises forming an upper hard mask stack over the barrier layer 125, patterning the hard mask stack, and patterning the barrier layer 125, the carbon layer 124, the metal silicide layer 123, and the silicon layer 122 using the patterned hard mask stack as a mask. The hard mask stack may comprise one or more layers selected from a Bottom Anti-Refection Coating (BARC) layer, a Dielectric Anti-Reflection Coating (DARC) layer (such as a silicon oxynitride layer), an organic hard mask layer (such as an amorphous carbon advanced patterning film), a conductive hard mask layer, a silicon hard mask layer, or an oxide hard mask layer.

Figure 5H:
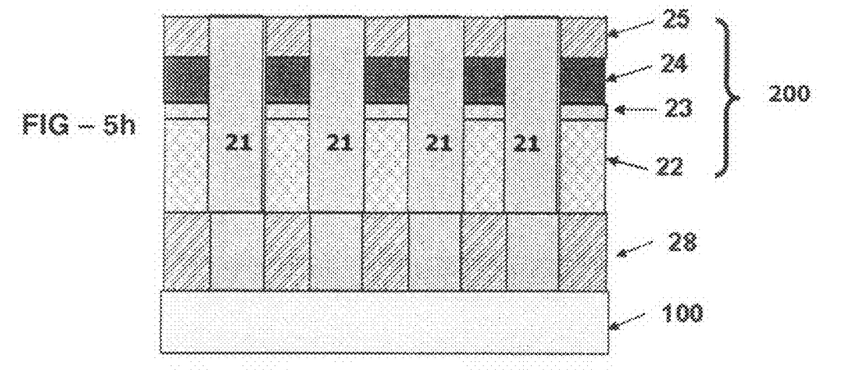

A second insulating layer can then be formed over and between the array of pillars 200, and be planarized, by CMP or etch back, to expose a top surface of the array of pillars, resulting in a structure of the array of pillars 200 isolated from each other by the second insulating layer 21, as illustrated in FIG. 5h.

Figure 5I:
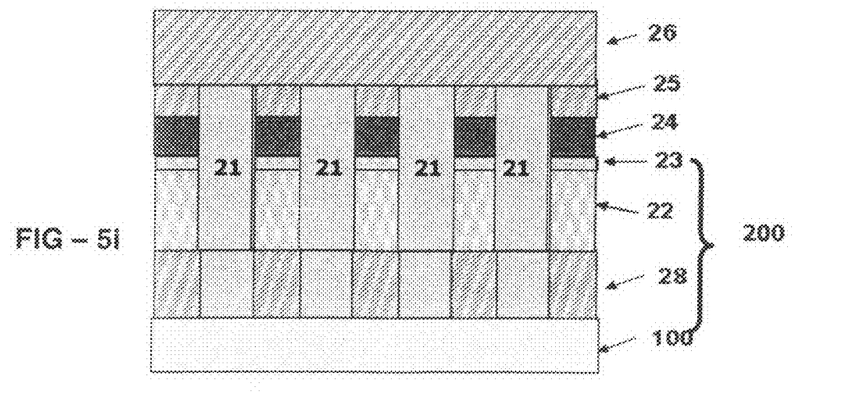

A plurality of upper electrodes 26 can then be formed over the second insulating layer 21 and the array of pillars 200 and insulating layer 21, by the subtractive or the Damascene processes described above with respect to FIGS. 3 or 4. The upper electrodes 26 may comprise any conductive material, such as tungsten, aluminum, copper, alloy thereof, tungsten nitride, titanium nitride, or a combination thereof. In some embodiments, the upper electrodes 26 may be formed in the same manner and of the same materials as bottom electrodes 28, but extend in a different direction, as illustrated in FIG. 5i. An example of a pillar shaped cell in which amorphous carbon is deposited by PECVD is shown in FIG. 1b (the thin titanium silicide layer is not labeled).

Alternatively, if the upper electrode 26 comprises a materials having a good adhesion with the carbon layer 24, such as titanium nitride, then the barrier layer 125, 25 may be omitted.

Formation of a first memory level has been described. Additional memory levels can be formed above this first memory level to form a monolithic three dimensional memory array. In some embodiments, conductors can be shared between memory levels; i.e. top conductor would serve as the bottom conductor of the next memory level. In other embodiments, an interlevel dielectric can be formed above the first memory level, its surface planarized, and construction of a second memory level begins on this planarized interlevel dielectric, with no shared conductors.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three dimensional structure memory." The substrates may be thinned or removed from the memory levels before bonding, but as the memory levels are initially formed over separate substrates, such memories are not true monolithic three dimensional memory arrays.

A monolithic three dimensional memory array formed above a substrate comprises at least a first memory level formed at a first height above the substrate and a second memory level formed at a second height different from the first height. Three, four, eight, or indeed any number of memory levels can be formed above the substrate in such a multilevel array.

Throughout this description, one layer has been described as being "above" or "below" another. It will be understood that these terms describe the position of layers and elements relative to the substrate upon which they are formed, in most embodiments a monocrystalline silicon wafer substrate; one feature is above another when it is farther from the wafer substrate, and below another when it is closer. Though clearly the wafer, or the die, can be rotated in any direction, the relative orientation of features on the wafer or die will not change. In addition, the drawings are purposefully not shown to scale and are merely representative of layers and processed layers.

The foregoing detailed description has described only a few of the many forms that this invention can take. For this reason, this detailed description is intended by way of illustration, and not by way of limitation. It is only the following claims, including all equivalents, which are intended to define the scope of this invention.

What is claimed is:

1. A nonvolatile memory cell, comprising:
   a storage element, the storage element comprising a carbon material;
   a steering element located in series with the storage element wherein the steering element comprises a p-i-n polysilicon diode; and
   a metal silicide layer located adjacent to the carbon material.

2. The nonvolatile memory cell of claim 1, wherein the metal silicide layer comprises at least one of titanium silicide, platinum silicide, cobalt silicide, tungsten silicide, or nickel silicide.

3. The nonvolatile memory cell of claim 1, wherein the metal silicide layer comprises titanium silicide.

4. The nonvolatile memory cell of claim 1, wherein the carbon material comprises at least one of carbon nanotube, amorphous carbon, polycrystalline carbon, graphene resistivity switching material, or a combination thereof.

5. The nonvolatile memory cell of claim 4, wherein the carbon material comprises polycrystalline carbon, amorphous carbon, or a combination thereof.

6. The nonvolatile memory cell of claim 1, wherein the nonvolatile memory cell is a read/write memory cell or a rewritable memory cell.

7. The nonvolatile memory cell of claim 1, wherein the nonvolatile memory cell is located in a monolithic three dimensional array of memory cells.

8. The nonvolatile memory cell of claim 1, wherein:
   the nonvolatile memory cell further comprises a bottom electrode located underneath the steering element and an upper electrode located over the storage element;
   the steering element comprises a cylindrical pillar diode;
   the storage element comprises a carbon layer having a substantial cylindrical pillar shape; and
   the metal silicide layer has a substantial cylindrical pillar shape and is located between the steering element and the storage element.

9. The nonvolatile memory cell of claim 8, wherein the cylindrical pillar diode, the carbon layer, and the metal silicide layer have a substantially same diameter.

10. A nonvolatile memory cell, comprising:
    a storage element, the storage element comprising a carbon material, wherein the carbon material comprises polycrystalline carbon, amorphous carbon, or a combination thereof;
    a steering element located in series with the storage element; and
    a metal silicide layer located adjacent to the carbon material.

11. The nonvolatile memory cell of claim 10, wherein the carbon material comprises amorphous carbon.

12. The nonvolatile memory cell of claim 10, wherein the carbon material comprises polycrystalline carbon.

13. The nonvolatile memory cell of claim 10, wherein the metal silicide layer comprises at least one of titanium silicide, platinum silicide, cobalt silicide, tungsten silicide, or nickel silicide.

14. The nonvolatile memory cell of claim 10, wherein the metal silicide layer comprises titanium silicide.

15. The nonvolatile memory cell of claim 10, wherein the steering element comprises a diode or a transistor.

16. The nonvolatile memory cell of claim 14, wherein the steering element comprises a p-i-n polysilicon diode.

17. The nonvolatile memory cell of claim 10, wherein the nonvolatile memory cell is a read/write memory cell or a rewritable memory cell.

18. The nonvolatile memory cell of claim 10, wherein the nonvolatile memory cell is located in a monolithic three dimensional array of memory cells.

19. A nonvolatile memory cell, comprising:
    a storage element, the storage element comprising a carbon material;
    a steering element located in series with the storage element; and
    a metal silicide layer located adjacent to the carbon material,
    wherein the nonvolatile memory cell is located in a monolithic three dimensional array of memory cells.

20. The nonvolatile memory cell of claim 19, wherein the metal silicide layer comprises at least one of titanium silicide, platinum silicide, cobalt silicide, tungsten silicide, or nickel silicide.

21. The nonvolatile memory cell of claim 19, wherein the metal silicide layer comprises titanium silicide.

22. The nonvolatile memory cell of claim 19, wherein the steering element comprises a diode or a transistor.

23. The nonvolatile memory cell of claim 22, wherein the steering element comprises a p-i-n polysilicon diode.

24. The nonvolatile memory cell of claim 19, wherein the carbon material comprises at least one of carbon nanotube, amorphous carbon, polycrystalline carbon, graphene resistivity switching material, or a combination thereof.

25. The nonvolatile memory cell of claim 24, wherein the carbon material comprises polycrystalline carbon, amorphous carbon, or a combination thereof.

26. The nonvolatile memory cell of claim 19, wherein the nonvolatile memory cell is a read/write memory cell or a rewritable memory cell.

* * * * *